United States Patent
Cong et al.

(10) Patent No.: US 12,270,752 B2
(45) Date of Patent: Apr. 8, 2025

(54) EPI SELF-HEATING SENSOR TUBE AS IN-SITU GROWTH RATE SENSOR

(71) Applicant: Applied Materials, Inc., Santa Clara, CA (US)

(72) Inventors: Zhepeng Cong, San Jose, CA (US); Tao Sheng, Santa Clara, CA (US); Ashur J. Atanos, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 213 days.

(21) Appl. No.: 17/751,197

(22) Filed: May 23, 2022

(65) Prior Publication Data

US 2023/0375460 A1  Nov. 23, 2023

(51) Int. Cl.
*G01N 21/03* (2006.01)
*C30B 25/14* (2006.01)
*C30B 25/16* (2006.01)
*G01N 21/84* (2006.01)
*H01L 21/67* (2006.01)

(52) U.S. Cl.
CPC ......... *G01N 21/0332* (2013.01); *C30B 25/14* (2013.01); *C30B 25/16* (2013.01); *G01N 21/8422* (2013.01); *H01L 21/67253* (2013.01); *G01N 2021/0389* (2013.01); *G01N 2021/8427* (2013.01)

(58) Field of Classification Search
CPC .......... G01N 21/0332; G01N 21/8422; G01N 2021/0389; G01N 2021/8427; G01N 21/9501; C30B 25/14; C30B 25/16; C30B 25/10; H01L 21/67253; C23C 16/46; C23C 16/482; C23C 16/52
See application file for complete search history.

(56) References Cited

U.S. PATENT DOCUMENTS 4,634,605 A * 1/1987 Wiesmann ............ H01L 31/202
427/249.17
5,326,404 A * 7/1994 Sato .................... C23C 16/4401
118/724

(Continued)

FOREIGN PATENT DOCUMENTS

CN  110470611 B * 8/2022 ............. G01N 21/25
JP  H10163182 A  6/1998
KR  20150000356 A  1/2015

OTHER PUBLICATIONS

International Search Report and Written Opinion for International Application No. PCT/US2023/010169 dated May 4, 2023.

*Primary Examiner* — Michelle M Iacoletti
*Assistant Examiner* — Maher Yazback
(74) *Attorney, Agent, or Firm* — Patterson + Sheridan, LLP

(57) ABSTRACT

A method and apparatus for determining a growth rate on a semiconductor substrate is described herein. The apparatus is an optical sensor, such as an optical growth rate sensor. The optical sensor is positioned in an exhaust of a deposition chamber. The optical sensor is self-heated using one or more internal heating elements, such as a resistive heating element. The internal heating elements are configured to heat a sensor coupon. A film is formed on the sensor coupon by exhaust gases flowed through the exhaust and is correlated to film growth on a substrate within a process volume of the deposition chamber.

20 Claims, 8 Drawing Sheets

(56) References Cited

U.S. PATENT DOCUMENTS

| | | | |
|---|---|---|---|
| 8,885,173 B2* | 11/2014 | Ohtsuka | G01B 11/0625 |
| | | | 356/504 |
| 9,347,886 B2 | 5/2016 | Voronov et al. | |
| 9,856,563 B2* | 1/2018 | Martinson | C23C 16/52 |
| 11,939,665 B2* | 3/2024 | Shinada | H01L 21/67184 |
| 11,988,497 B2* | 5/2024 | Arata | G01B 5/06 |
| 2011/0253044 A1* | 10/2011 | Tam | C23C 16/45519 |
| | | | 118/712 |
| 2011/0308453 A1 | 12/2011 | Su et al. | |
| 2014/0377890 A1 | 12/2014 | Voronov et al. | |
| 2015/0325488 A1 | 11/2015 | Yamada et al. | |
| 2016/0349038 A1* | 12/2016 | Ohtsuka | G01N 21/896 |
| 2018/0010243 A1 | 1/2018 | Lee et al. | |
| 2020/0225126 A1* | 7/2020 | Sur | G01N 1/2252 |
| 2022/0074048 A1* | 3/2022 | Preti | C30B 23/063 |
| 2023/0110359 A1* | 4/2023 | Huang | C30B 15/203 |
| | | | 117/15 |

* cited by examiner

EPI SELF-HEATING SENSOR TUBE AS IN-SITU GROWTH RATE SENSOR

BACKGROUND

Field

Embodiments of the present disclosure generally relate to apparatus and methods for fabricating semiconductor devices. More specifically, apparatus disclosed herein relate to exhaust assemblies and growth rate sensors within an epitaxial deposition process chamber. Methods of using the same are also disclosed.

Description of the Related Art

Semiconductor substrates are processed for a wide variety of applications, including the fabrication of integrated devices and micro-devices. One method of substrate processing includes depositing a material, such as a dielectric material or a conductive metal, on an upper surface of the substrate in a processing chamber. For example, epitaxy is a deposition process that grows a thin, ultra-pure layer, usually of silicon or germanium on a surface of a substrate. The material may be deposited in a lateral flow chamber by flowing a process gas parallel to the surface of a substrate positioned on a support and thermally decomposing the process gas to deposit a material from the process gas onto the substrate surface.

Film thickness measurements of a processed substrate may be used in relation to processing operations. The film thickness measurements may be taken outside of a process chamber in which the processed substrate is processed, after the processing operations are conducted (e.g., offline). Offline measurements may involve inefficiencies and reduced throughput as substrates which do not meet specifications may not be used, and it can take several processing iterations to obtain measurements that meet specifications.

Additionally, it is difficult to conduct film thickness measurements within the process chamber and during the processing operations because processing equipment in the process chamber may interfere with measurement equipment, thereby hindering measurement accuracy. For example, infrared lamp radiation and heat emitted from the lamps can interfere with measurement equipment.

Therefore, there is a need for improved apparatus and methods for in situ measurement of film thickness in processing chambers.

SUMMARY

Embodiments of the present disclosure generally relate to in situ monitoring of film growth in processing chambers. More particularly, embodiments disclosed herein relate to sensor assemblies for epitaxial chambers and methods of use thereof, and related apparatus.

The present disclosure generally relates to process chambers for semiconductor processing. In one embodiment, a growth rate sensor suitable for use during semiconductor substrate manufacturing is described. The growth rate sensor includes a body, an optically transparent window disposed at an end of the body, a silicon containing coupon disposed inside of the body and adjacent to the optically transparent window, a resistive heating element disposed within the body and adjacent to the optically transparent window, a radiation sensor, and an optical fiber disposed between the radiation sensor and the optically transparent window.

In another embodiment, an exhaust assembly suitable for use during semiconductor substrate manufacturing is described. The exhaust assembly includes one or more exhaust passage bodies, an exhaust collector disposed at a distal end of the one or more exhaust passage bodies, and a growth rate sensor disposed within the exhaust collector. The growth rate sensor includes an optically transparent window, a silicon containing coupon disposed on a first side of the optically transparent window, and a resistive heating element disposed on a second side of the optically transparent window.

In another embodiment, a process chamber suitable for use during semiconductor substrate processing is described. The process chamber includes a chamber body, a substrate support disposed within a process volume of the chamber body, an upper window disposed above the substrate support and the process volume, a lower window disposed below the substrate support and the process volume, a gas injector disposed within the chamber body, an exhaust system disposed within the chamber body opposite the gas injector, and a growth rate sensor disposed within the exhaust system. The growth rate sensor includes an optically transparent window, a silicon containing coupon disposed on a first side of the optically transparent window, and a resistive heating element disposed on a second side of the optically transparent window.

In another embodiment, a non-transitory computer-readable medium is described. The non-transitory computer-readable medium stores instructions that, when executed by a processor, cause a computer system to perform several process operations. The process operations includes monitoring an intensity of radiation reflected by or transmitted through a growth rate sensor. The growth rate sensor further includes an optically transparent window, a silicon containing coupon disposed on a first side of the optically transparent window, and a resistive heating element disposed on a second side of the optically transparent window. The process operations further include heating the sensor coupon using an internal heating element during monitoring of the intensity of the radiation and determining a growth rate of a film deposited onto the sensor coupon from the change in the intensity of the radiation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
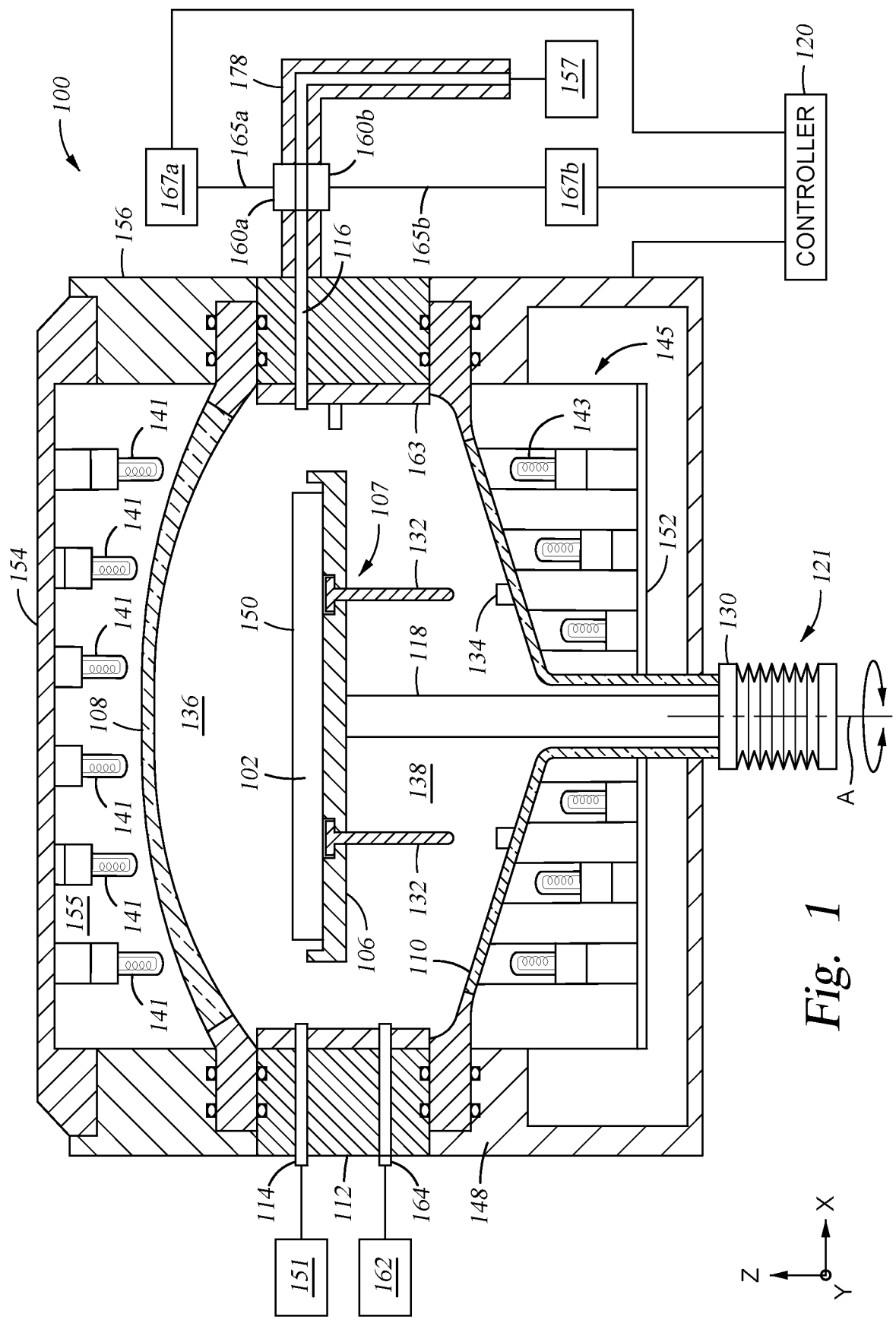
FIG. 1 is a schematic illustration of a deposition chamber, according to embodiments of the present disclosure.

The present disclosure relates to exhaust assemblies and growth rate sensors within a semiconductor process chamber. The growth rate sensors perform in situ monitoring of film growth in a processing chamber. As an example, embodiments disclosed herein provide apparatus and methods for in situ monitoring of film growth and measurement of film thickness in processing chambers, such as epitaxial deposition chambers.

Embodiments disclosed herein provide a growth rate sensor positioned in an exhaust of the processing chamber in such a way as to receive epitaxial film growth thereon. The film growth on the growth rate sensor simulates the epitaxial film growth occurring simultaneously on a substrate positioned in the processing chamber. The growth rate sensor is heated to have a similar temperature to the substrate in the process volume of the processing chamber.

Embodiments disclosed herein enable a substrate and/or a coupon to have a temperature similar to a substrate being processed in the processing chamber to simulate the film deposition characteristics of the substrate.

Embodiments disclosed herein provide a sensor window and a substrate/coupon having a composition which enables backside spectral wavelength measurements in either reflection mode, transmission mode, or both of the reflection mode and the transmission mode.

Embodiments disclosed herein provide a sensor assembly which enables spectral reflectivity measurements with low signal-to-noise ratio characteristics inside of an epitaxial deposition chamber. The noise includes noise resulting from infrared lamp radiation in the epitaxial chambers. Sensor assembly embodiments described herein provide a sensor body with a radiation path therein. The sensor body is sealed from stray infrared radiation. Sensor assembly embodiments described herein provide a growth rate sensor which includes a resistive heating element for providing a controlled temperature of the growth rate sensor. The resistive heating element increases a temperature of the sensor window and advantageously raises a temperature of the sensor window and a substrate/coupon disposed on the sensor window towards a temperature of a substrate being processed. Sensor assembly embodiments described herein provide an optical path which is isolated from process gas flow.

Self-heating of the growth rate sensor using a resistive heating element or another heating element enables flexible installation of the growth rate sensor in various locations of the process chamber. The flexible installation location of the growth rate sensor is able to maintain improved sensitivity as the self-heating of the growth rate sensor prevents the detection sensitivity from degrading with changes in location of the sensor. Use of self-heating sensors as in-situ growth rate sensors also reduces the need for signal modulation. Heating of the window and the substrate/coupon of the growth rate sensor also assists in regeneration of the substrate/coupon during a cleaning operation within the process chamber.

In some embodiments, the growth rate sensor is positioned inside of an exhaust, such that gas flow is still provided across the growth rate sensor and radiation emitted by lamps or other radiation sources within the process volume is reduced. Reduced background radiation enables larger wavelength ranges which may be utilized by the growth rate sensor in determining the growth rate.

A quartz body is disposed around at least part of the growth rate sensor and isolates the growth rate sensor from the deposition environment.

FIG. 1 is a schematic illustration of a deposition chamber 100, according to embodiments of the present disclosure. The deposition chamber 100 is an epitaxial deposition chamber. The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper window 108, a lower window 110, a plurality of upper lamps 141, and a plurality of lower lamps 143. As shown, the controller 120 is in communication with the deposition chamber 100 and is used to control processes, such as those described herein. The substrate support 106 is disposed between the upper window 108 and the lower window 110. The plurality of upper lamps 141 are disposed between the upper window 108 and a lid 154. The plurality of upper lamps 141 form a portion of the upper lamp module 155. The lid 154 may include a plurality of sensors (not shown) disposed therein for measuring the temperature within the deposition chamber 100. The plurality of lower lamps 143 are disposed between the lower window 110 and a floor 152. The plurality of lower lamps 143 form a portion of a lower lamp module 145. The upper window 108 is an upper dome and is formed of an energy transmissive material, such as quartz. The lower window 110 is a lower dome and is formed of an energy transmissive material, such as quartz.

A process volume 136 is formed between the upper window 108 and the lower window 110. The process volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the process volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides are disposed below the plurality of process gas inlets 114 and the one or more exhaust gas outlets 116. The flow guide is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the process volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157.

The one or more exhaust gas outlets 116 are further connected to or include an exhaust system 178. The exhaust system 178 fluidly connects the one or more exhaust gas outlets 116 and the exhaust pump 157. The exhaust system 178 as described herein includes one or more growth monitors 160a, 160b. Each of the one or more growth monitors 160a, 160b are coupled to an optical module 167a, 167b. Therefore, a first growth monitor 160a is coupled to a first optical module 167a while a second growth monitor 160b is coupled to a second optical module 167b. A first fiber optic cable 165a optically couples the first growth monitor 160a and the first optical module 167a. A second fiber optic cable 165b optically couples the second growth monitor 160b and the second optical module 167b.

Figure 2:
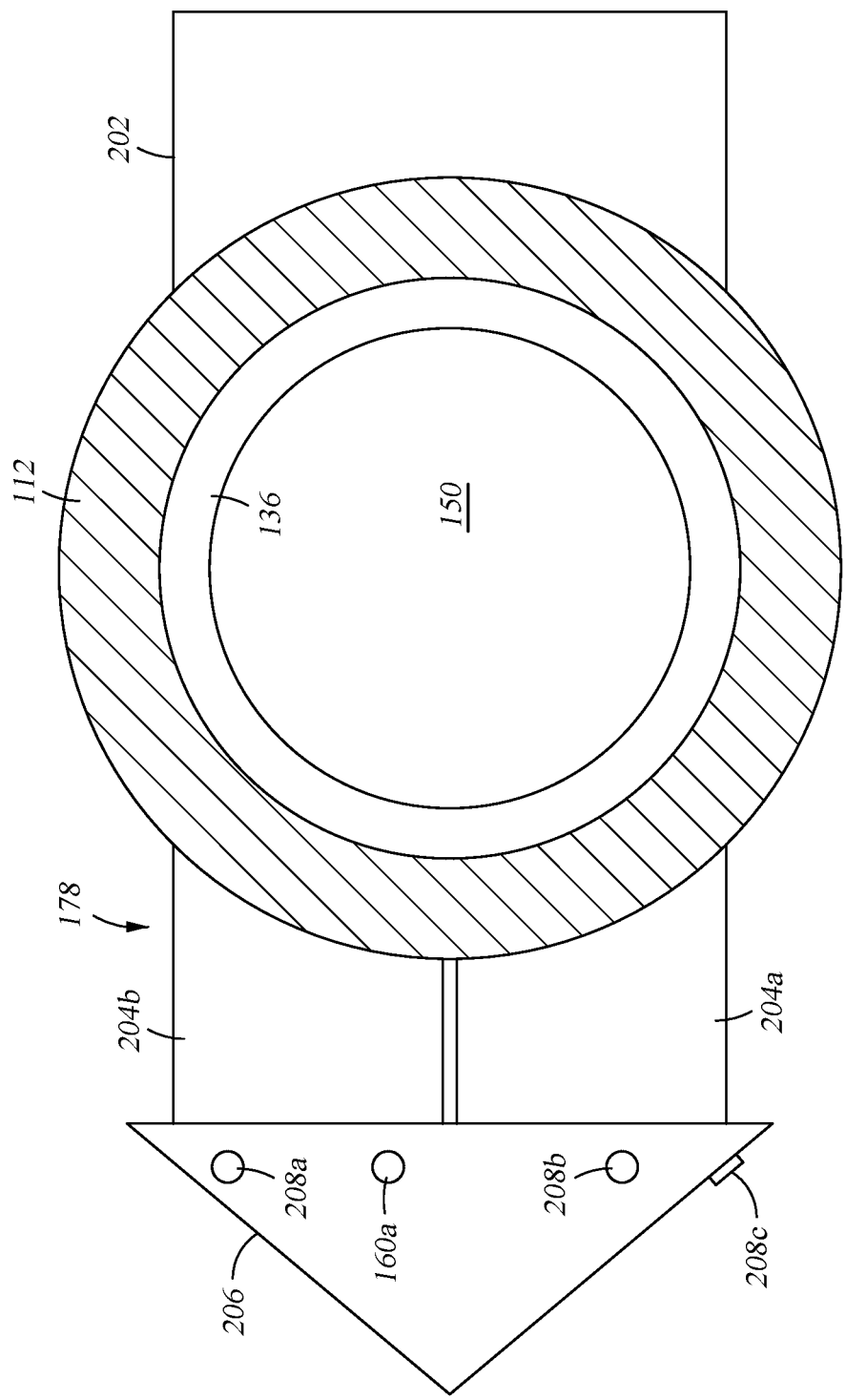
FIG. 2 illustrates a cross-sectional plan view of the deposition chamber of FIG. 1, according to embodiments of the present disclosure.

FIG. 2 illustrates a cross-sectional plan view of the deposition chamber 100 of FIG. 1, according to embodiments of the present disclosure. The deposition chamber 100 includes an injector 202 disposed across from the exhaust system 178. The injector 202 includes the process gas inlets 114 and is fluidly coupled to the process gas source 151. The injector 202 may be disposed through as least a portion of the flow module 112 or may be a part of the flow module 112. The exhaust system 178 is disposed on the opposite side of the process volume 136 from the injector 202. The exhaust system 178 is formed through, attached to, or a part of the flow module.

The exhaust system 178 further includes at least one exhaust passage body 204a, 204b. The exhaust passage bodies 204a, 204b form an exhaust path for gas leaving the process volume 136 before entering an exhaust collector 206. As shown in FIG. 2, there is a first exhaust passage body 204a and a second exhaust passage body 204b. The first exhaust passage body 204a and the second exhaust passage body 204b are mirror images and may be similar in size and configuration. In other embodiments, there may be more or less exhaust passage bodies 204a, 204b. In some embodiments there is only one exhaust passage body, such that the two exhaust passage bodies 204a, 204b are merged into a single body. In yet other embodiments, there may be three or more exhaust passage bodies, such as three exhaust passage bodies 204a, 204b. The size and configuration of the exhaust passage bodies 204a, 204b may change depending upon the size and operation of the deposition chamber 100.

Both of the first exhaust passage body 204a and the second exhaust passage body 204b are coupled to the exhaust collector 206 on the opposite end of the exhaust passage bodies 204a, 204b from the process volume 136. The exhaust collector 206 is configured to collect the exhaust from the first exhaust passage body 204a and the second exhaust passage body 204b. The exhaust collector 206 narrows as the exhaust collector 206 extends away from the exhaust passage bodies 204a, 204b. The growth monitors 160a, 160b are disposed within the exhaust collector 206. The growth monitors 160a, 160b are disposed adjacent to an entrance to the exhaust collector 206 from the exhaust passage bodies 204a, 204b. The growth monitors 160a, 160b may be placed in various positions within the exhaust collector 206 and/or the exhaust passage bodies 204a, 204b. There may be additional growth monitors 208a, 208b, 208c also disposed within the exhaust collector 206 and/or the exhaust passage bodies 204a, 204b. The additional growth monitors 208a, 208b, 208c may be similar to the growth monitors 160a, 160b or may be different types of growth monitors, such as a quartz crystal growth monitor.

Figure 3:
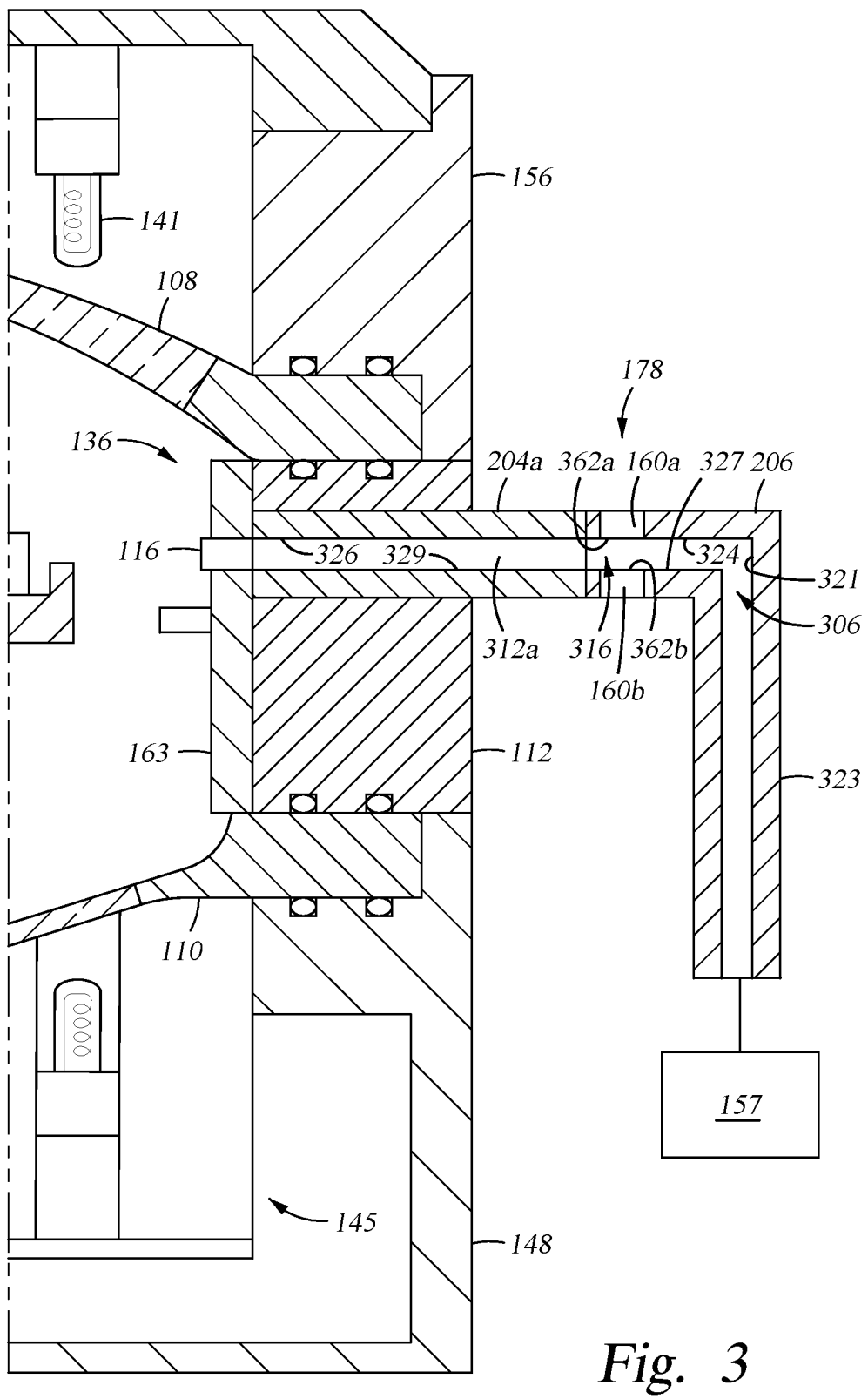
FIG. 3 illustrates a cross-sectional side view of the exhaust system of the deposition chamber of FIG. 1, according to embodiments of the present disclosure.

FIG. 3 illustrates a cross-sectional side view of the exhaust system 178 of the deposition chamber 100 of FIG. 1. Inside each of the exhaust passage bodies 204a, 204b is an exhaust plenum. An exhaust plenum 312a of the first exhaust passage body 204a is illustrated and a similar second exhaust plenum is disposed through the second exhaust passage body 204b. As shown in FIG. 3, the exhaust plenum 312a of the exhaust system 178 extends through at least a portion of the flow module 112, such that the exhaust plenum 312a extends through the sidewall of the flow module 112 and interacts with the process volume 136.

Gas is exhausted from the process volume 136 into the exhaust plenum 312a. From the exhaust plenum 312a, the gas is further flowed into a collector plenum 316. The collector plenum 316 is a plenum disposed within the exhaust collector 206.

One or more growth monitors 160a, 160b are located either within the exhaust plenum 312a or within the collector plenum 316. The first growth monitor 160a is disposed within an inside upper surface 324 of the exhaust collector 206 and the collector plenum 316. The second growth monitor 160b is disposed within an inside lower surface 327 of the exhaust collector 206 and the collector plenum 316. Alternatively or in addition to the placement of the growth monitors 160a, 160b within the exhaust collector, one or more similar growth monitors are positioned inside of an inner upper surface 326 or an inner lower surface 329 of the exhaust passage bodies 204a, 204b and in communication with the exhaust plenum 312a. The growth monitors 160a, 160b are disposed in either the inside upper surface 324 or the inside lower surface 327 of the collector plenum 316 so that the growth monitors 160a, 160b do not block the flow path of the exhaust gases, but still enable deposition on a sensor coupon 362a, 362b. The first growth monitor 160a includes a sensor coupon 362a oriented downward and facing the inner lower surface 328. The second growth monitor 160b includes a second sensor coupon 362b oriented upward and facing the inside upper surface 324.

Exhaust gas passes over the growth monitors 160a, 160b and into the collector plenum 316 before being removed from the exhaust collector 206 through a conduit opening 306 of the exhaust conduit 323. The conduit opening 306 is disposed at a portion of the collector plenum 316 opposite the end of the collector plenum 316 adjacent to the exhaust plenum 312a and the exhaust passage bodies 204a, 204b. The conduit opening 306 is configured to enable venting of the exhaust gas within the exhaust collector 206 through an exhaust conduit 323 and to an exhaust pump 157. A back sidewall 321 of the exhaust plenum 312a is disposed adjacent to the conduit opening 306 and may be configured to direct gas into the conduit opening 306. The conduit opening 306 is disposed through the inside lower surface 327 of the collector plenum 316 and opens into the exhaust conduit 323. The exhaust conduit 323 extends downward from the conduit opening 306 and is fluidly connected to the exhaust pump 157.

FIGS. 4A-4D illustrate different embodiments of growth monitors 160a, 160b, 160c, 160d for use within the deposition chamber of FIG. 1. Each of the growth monitors 160a, 160b, 160c, 160d are configured to measure a change in transmission and/or reflection of radiation through a coupon, such as the sensor coupon 362a of FIGS. 4A and 4C or the sensor coupon 362b of FIGS. 4B and 4D. The change in transmission and/or reflection of radiation through the coupon is caused by a growth of a film 476 on the sensor coupon 362a, 362b. As the film 476 grows, the radiation wavelength and intensity which passes through or is reflected off of the sensor coupon 362a, 362b changes and is measured to determine a growth rate of the film 476. The growth rate of the film 476 may be correlated to a growth rate on a substrate, such as the substrate 102 within the deposition chamber 100. The growth monitors 160a, 160b, 160c, 160d are heated using one or more heating elements. The one or more internal heating elements may be a resistive heating element, a Peltier device, an infrared (IR) heating element, or a heated fluid conduit. Other heating devices are also contemplated and may be utilized as the one or more internal heating elements. The one or more heating elements are configured to be adjacent to the sensor coupon 362, 362b.

Figure 4A:
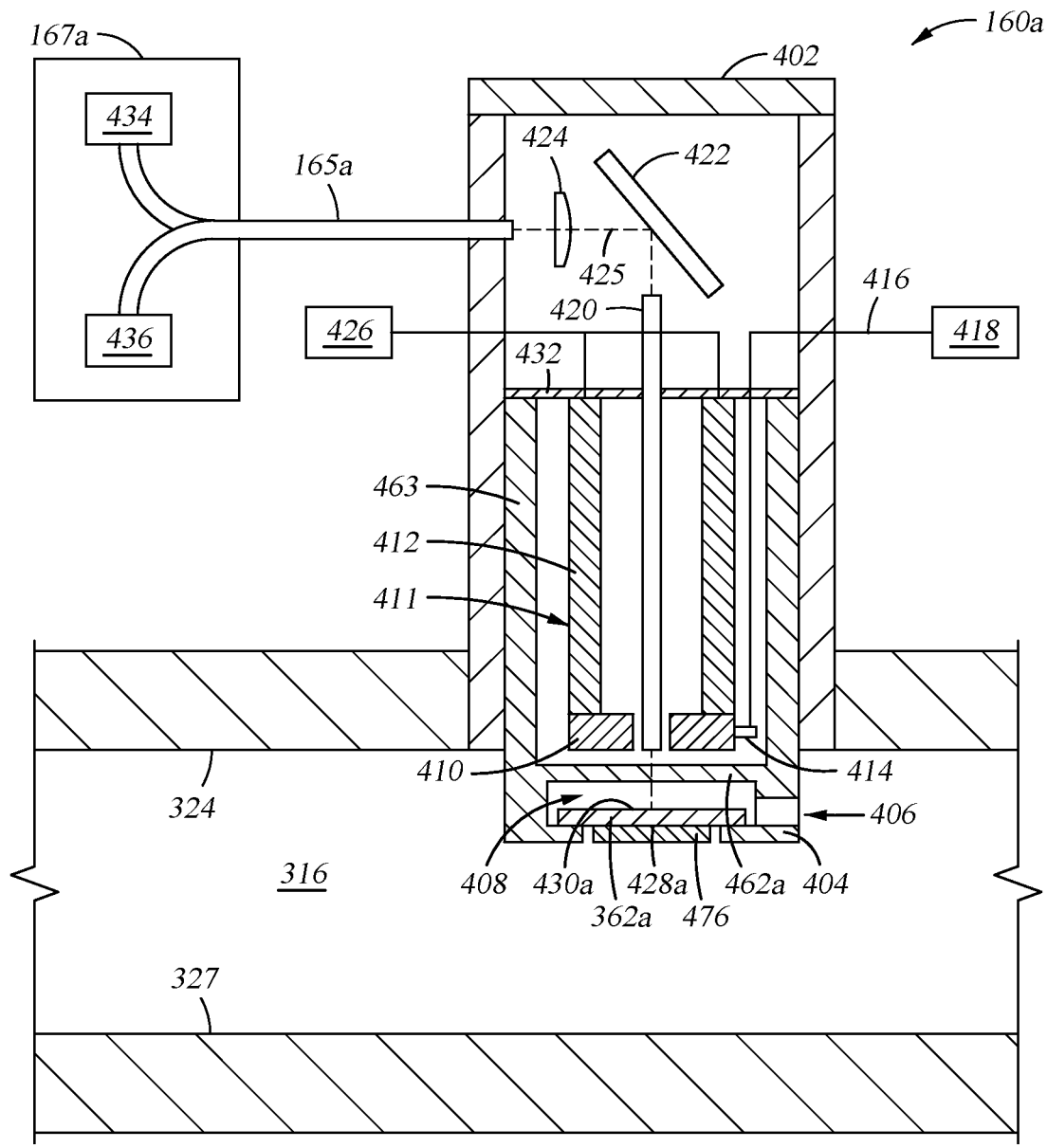
FIGS. 4A-4D illustrate growth rate monitors for use within the deposition chamber of FIG. 1, according to embodiments of the present disclosure.

FIG. 4A illustrates a first embodiment of a growth monitor 160a. The growth monitor 160a of FIG. 4A includes an outer body 402 and an optically transparent inner body 463. The growth monitor 160a is positioned such that the growth monitor 160a is disposed through the inside upper surface 324. The growth monitor 160a is also configured such that it includes a radiation source 434 disposed in first optical module 167a. The placement of the radiation source 434 within the first optical module 167a along with a radiation sensor 436 enables the growth monitor 160a of FIG. 4A to be a reflective monitor and measure the radiation reflected by the sensor coupon 362a from the radiation beam emitted by the radiation source 434. The first optical module 167a may also utilize background radiation which passes through the sensor coupon 362a from the collector plenum 316 instead of the radiation source 434.

The radiation sensor 436 may include an optical spectrometer. Other radiation sensors 436 are also contemplated and may be utilized. The radiation which is measured by the radiation sensor 436 is about 0.5 μm to about 6 μm, such as about 1 μm to about 5 μm, such as about 2 μm to about 4 μm. The radiation which is emitted by the radiation source 434 is about 0.5 μm to about 6 μm, such as about 1 μm to about 5 μm, such as about 2 μm to about 4 μm.

The outer body 402 and the optically transparent inner body 463 together form a body of the growth monitor 160a. The outer body 402 is disposed through a wall of the exhaust system 178, such that the outer body 402 is disposed through the inside upper surface 324 and a bottom of the growth monitor 160a is exposed to the collector plenum 316 and exhaust gases passing through the exhaust system 178. The transparent inner body 463 is transparent to radiation within a pre-determined range. In some embodiments, the transparent inner body 463 has a 90% or greater transmittance of radiation between a wavelength of and 0.2 μm to about 5.0 μm, such as about 0.5 μm to about 5.0 μm, such as about 1.0 μm to about 4.5 μm. The wavelength over which the transparent inner body 463 is transparent may be at least partially influenced by the type of heating source. The transparent inner body 463 may be transparent to radiation emitted by the radiation source 434 and radiation received by the radiation sensor 436. A portion of the transparent inner body 463 is formed by an optically transparent window 462a. The optically transparent window 462a is disposed adjacent to the collector plenum 316. The optically transparent window 462a may be the same material or a different material from the rest of the transparent inner body 463.

The sensor coupon 362a is disposed adjacent to the optically transparent window 462a and the transparent inner body 463. The sensor coupon 362a includes a deposition surface 428a and a backside surface 430a. The deposition surface 428a is oriented towards the inside lower surface 327. The film 476 is grown on the deposition surface 428a during a processing operation and is correlated to a film growth on a substrate within a process volume of a semiconductor processing chamber, such as the deposition chamber 100.

In the growth monitor 160a, a cover 404 is utilized to secure the sensor coupon 362a to the transparent inner body 463. The cover 404 is configured to partially surround the sensor coupon 362a to enable the cover 404 to secure the sensor coupon 362a. As shown in FIG. 4A, the outer edges of the deposition surface 428a of the sensor coupon 362a are covered by the cover 404 and held to secure the sensor coupon 362a. A central portion of the deposition surface 428a of the sensor coupon 362a is left uncovered and exposed to the collector plenum 316.

A backside sensor plenum 408 is formed above the sensor coupon 362a and between the backside surface 430a and the optically transparent window 462a. The backside sensor plenum 408 reduces pressure on the sensor coupon 362a which may otherwise be applied by the cover 404 if the cover 404 held the backside surface 430a flush with the optically transparent window 462a. Utilizing the backside sensor plenum 408 may cause a pressure differential between the backside sensor plenum 408 and the collector plenum 316 during processing. Therefore, to prevent damage to the sensor coupon 362a due to a pressure differential, one or more equalization ports (not shown) may be disposed between an outside surface of the transparent inner body 463 and the backside sensor plenum 408 to allow pressure equalization between the backside sensor plenum 408 and the surrounding volume, such as the collector plenum 316.

The cover 404 may include a coupon transfer opening 406. The coupon transfer opening 406 may be positioned either an upstream or a downstream position. The coupon transfer opening 406 is configured to enable transfer of the sensor coupon 362a into and out of the cover 404. The bottom surface of the cover 404 therefore acts as a shelf and the coupon transfer opening 406 may have a surface coplanar with the support surface of the cover 404 which supports the sensor coupon 362a. The coupon transfer opening 406 has a width at least the same size as the width of the sensor coupon 362a. Therefore the coupon transfer opening 406 is a rectangular or arcuate opening through the transparent inner body 463. The coupon transfer opening 406 may be patched or filled before positioning the transparent inner body 463 inside of the collector plenum 316. The patch or fill may be a plug. The material of the patch or fill material is the same material as the transparent inner body 463 and may be coated or positioned using a high-temperature coating operation.

In one or more examples, a thickness of the sensor coupon 362a is about 400 μm or less, such as about 200 μm to about 400 μm, such as about 250 μm to about 350 μm, such as about 300 μm. The thickness of the sensor coupon 362a is configured to reduce radiation attenuation therethrough. In one or more examples, the sensor coupon 362a has a crystalline structure. Advantageously, the crystalline structured sensor coupon 362a increases radiation transmission and thermal conductivity relative to a corresponding amorphous material. Therefore, heat and radiation may be transmitted easily between the optically transparent window 462a and the sensor coupon 362a. Therefore, heating of the sensor coupon 362a is more predictable and uniform while radiation from a radiation source easily passes through the sensor coupon 362a to be measured. In one embodiment, which can be combined with other embodiments, the sensor coupon 362a is a silicon containing coupon. In one embodiment, the sensor coupon 362a is formed from silicon carbide (e.g., SiC). Other materials are contemplated for the sensor coupon 362a. Advantageously, a silicon carbide sensor coupon 362a provides a spectral transmission signal for any silicon-based doped or undoped film deposited thereon, in contrast to a sensor coupon 362a formed from only silicon which fails to provide a spectral transmission signal for silicon-based films. In one embodiment, which can be combined with other embodiments, the sensor coupon 362a is crystalline silicon carbide. The crystalline structure of the sensor coupon 362a is 6H, 4H, 3C, or combinations thereof.

The deposition surface 428a of the sensor coupon 362a has a roughness of less than 3 nm, such as less than 2 nm, such as less than 1 nm. In one embodiment, which can be combined with other embodiments, the transparent inner body 463 and the optically transparent window 462a are formed from silicon carbide (e.g., SiC), quartz (e.g., black quartz, black opaque quartz, or white opaque quartz), or combinations thereof. Other materials are also contemplated and may be utilized within the transparent inner body 463. The material and geometry of the transparent inner body 463 is configured to reduce stray radiation which passes through the transparent window 462a and is within the transparent inner body 463. The stray radiation is reduced at a wavelength of about 300 nm to about 1000 nm, such as about 400 nm to about 800 nm.

The outer body 402 is a metal material and may be configured to absorb any radiation which escapes the transparent inner body 463. The outer body 402 is a metal material, such as stainless steel. Other materials are also contemplated and may be utilized within the outer body 402. In some embodiments, an inner surface of the outer body 402 is gold plated. Other materials are also contemplated and may be utilized as a plating or film within the outer body 402. Both the outer body 402 and the transparent inner body 463 have a cylindrical outer wall and a cylindrical inner wall. In some embodiments, the inner and outer walls of the outer body 402 and the transparent inner body 463 are prisms, such as a rectangular prism, a pentagonal prism, or a hexagonal prism. Other prisms may also be utilized.

An internal heating element 411 is disposed within the outer body 402 and the transparent inner body 463. The internal heating element 411 may be a resistive heating element, a Peltier device, or a heated fluid conduit. Other heating devices are also contemplated and may be utilized as the internal heating element 411. In the embodiments described herein, the internal heating element 411 is a resistive heating element. The internal heating element 411 provides rapid and precise control of a temperature of the sensor coupon 362a. In some embodiments, the internal heating element 411 is able to heat the sensor coupon 362a and control heating of the sensor coupon 362a between about 300° C. to about 1200° C., such as about 400° C. to about 1000° C., such as about 500° C. to about 900° C. The temperature of the sensor coupon 362a is controlled with a precision of less than about 10° C., such as less than about 7° C., such as less than about 5° C.

The internal heating element 411 includes a low resistance element 412 and a high resistance element 410. The high resistance element 410 has a higher resistivity than the low resistance element 412, such that the resistivity of the high resistance element 410 is greater than 10 times the resistivity of the low resistance element 412, such as greater than 20 times the resistivity of the low resistance element 412, such as greater than 50 times the resistivity of the low resistance element 412. The high resistance element 410 is disposed adjacent to the optically transparent window 462a and the sensor coupon 362a. The high resistance element 410 has a resistivity of about $10^3$ Ω·cm to about $10^6$ Ω·cm, such as about 2000 Ω·cm to about 10,000 Ω·cm, such as about $10^4$ Ω·cm to about $10^5$ Ω·cm, such as about $10^5$ Ω·cm to about $10^6$ Ω·cm. The low resistance element 412 has a resistivity of about 0.1 Ω·cm to about 100 Ω·cm, such as about 1 Ω·cm to about 10 Ω·cm, such as about 10 Ω·cm to about 100 Ω·cm. The low resistance element 412 is configured to transfer power from one or more power sources 426 to the high resistance element 410. The high resistance element 410 is configured to be heated when a power is applied thereto.

A temperature measurement device 414 is disposed adjacent to and/or contacting the high resistance element 410. The temperature measurement device 414 is configured to measure the temperature of one or both of the optically transparent window 462a and the sensor coupon 362a. The temperature measurement device 414 of the growth monitor 160 is a thermocouple or a pyrometer. Other temperature measurement devices are also contemplated and may be utilized as the temperature measurement device 414. The temperature measurement device 414 is coupled to a temperature measurement receiver 418 by wiring 416. The temperature measurement receiver 418 is configured to apply a power to the thermocouple and measure the voltage and corresponding voltage changes of the thermocouple. In some embodiments, the temperature measurement receiver 418 is integrated into the controller 120. In some embodiments, a band gap absorption of the sensor coupon 362a and/or the optically transparent window 462 is measured to determine the temperature of the optically transparent window 462 and the sensor coupon 362a. This may be in addition to or as an alternative to the temperature measurement device 414.

The growth monitor 160a further includes one or more lenses 424 and one or more mirrors 422. The lenses 424 and the mirrors 422 are configured to collimate and orient the radiation between the sensor coupon 362a and the radiation sensor 436. A partition 432 is positioned between the lower end of the growth monitor 160a and the upper end of the growth monitor 160a. The lower end includes the high resistance element 410, the low resistance element 412, the sensor coupon 362a, the optically transparent window 462a, the optically transparent inner body 463, and the temperature measurement device 414. The upper end includes the one or more lenses 424 and the one or more mirrors 422. The partition may reduce stray radiation which interacts with the one or more lenses 424 and the one or more mirrors 422.

One or more fiber optic cables 420, 165a are disposed along the radiation measurement path 425. A first fiber optic cable 165a is disposed between the first optical module 167a and the body of the growth monitor 160a. A second fiber optic cable 420 is disposed between the optically transparent window 462/the sensor coupon 362a and the mirrors 422/lenses 424. In some embodiments, the second fiber optic cable 420 is omitted.

Figure 4B:
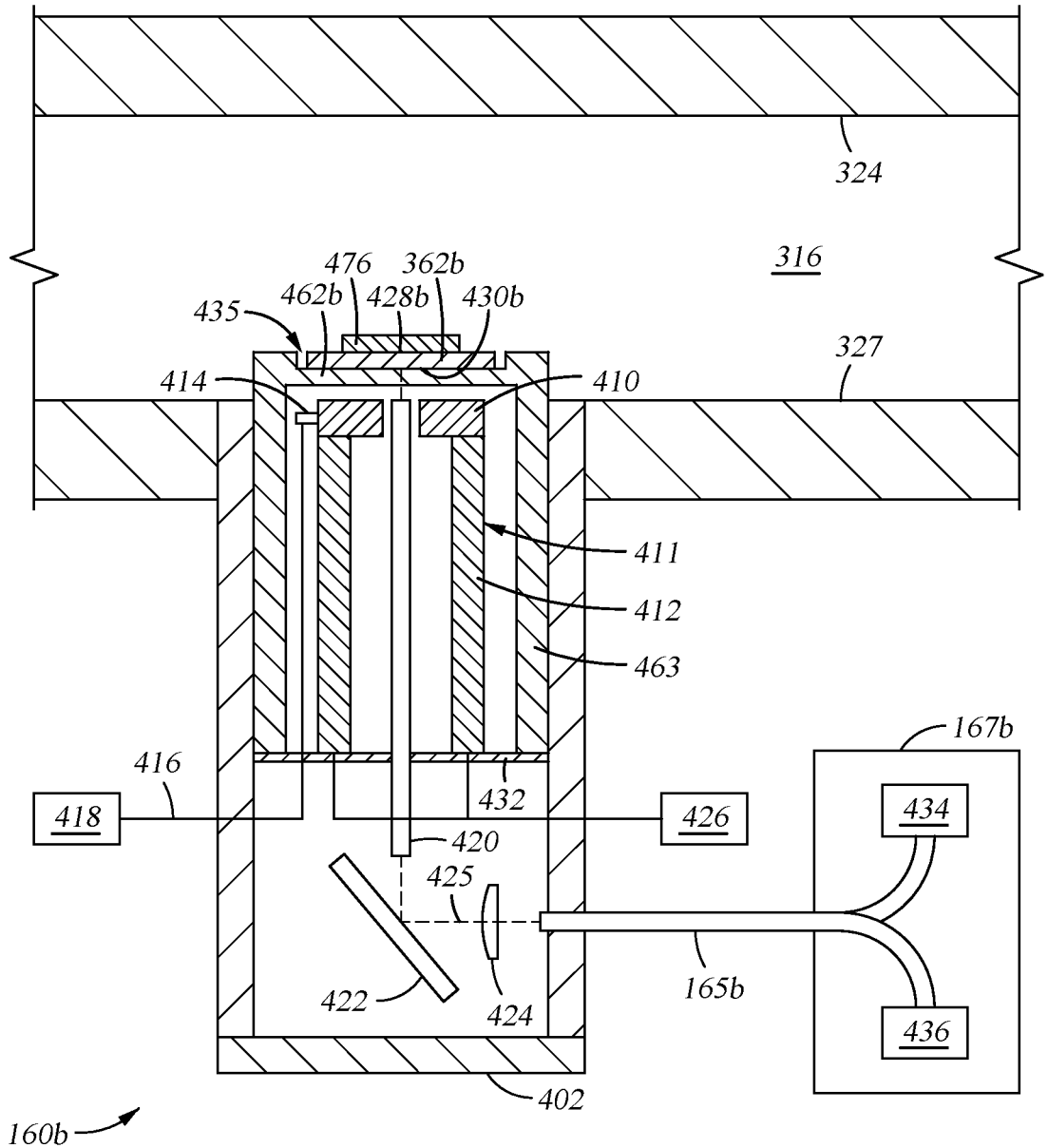

FIG. 4B illustrates a second embodiment of a growth monitor 160b. The growth monitor 160b of FIG. 4B is similar to the growth monitor 160a of FIG. 4A, but the growth monitor 160b is disposed through an inside lower surface 327 of the exhaust collector 206.

The growth monitor 160a is also configured such that it includes the radiation source 434 and the radiation sensor 436 disposed in the second optical module 167b. The placement of the radiation source 434 within the second optical module 167b along with a radiation sensor 436 enables the growth monitor 160b of FIG. 4B to be a reflective monitor and measure the radiation reflected by the sensor coupon 362b from the radiation beam emitted by the radiation source 434. The second optical module 167b may also utilize background radiation which passes through the sensor coupon 362b from the collector plenum 316 instead of the radiation source 434.

Figure 4C:
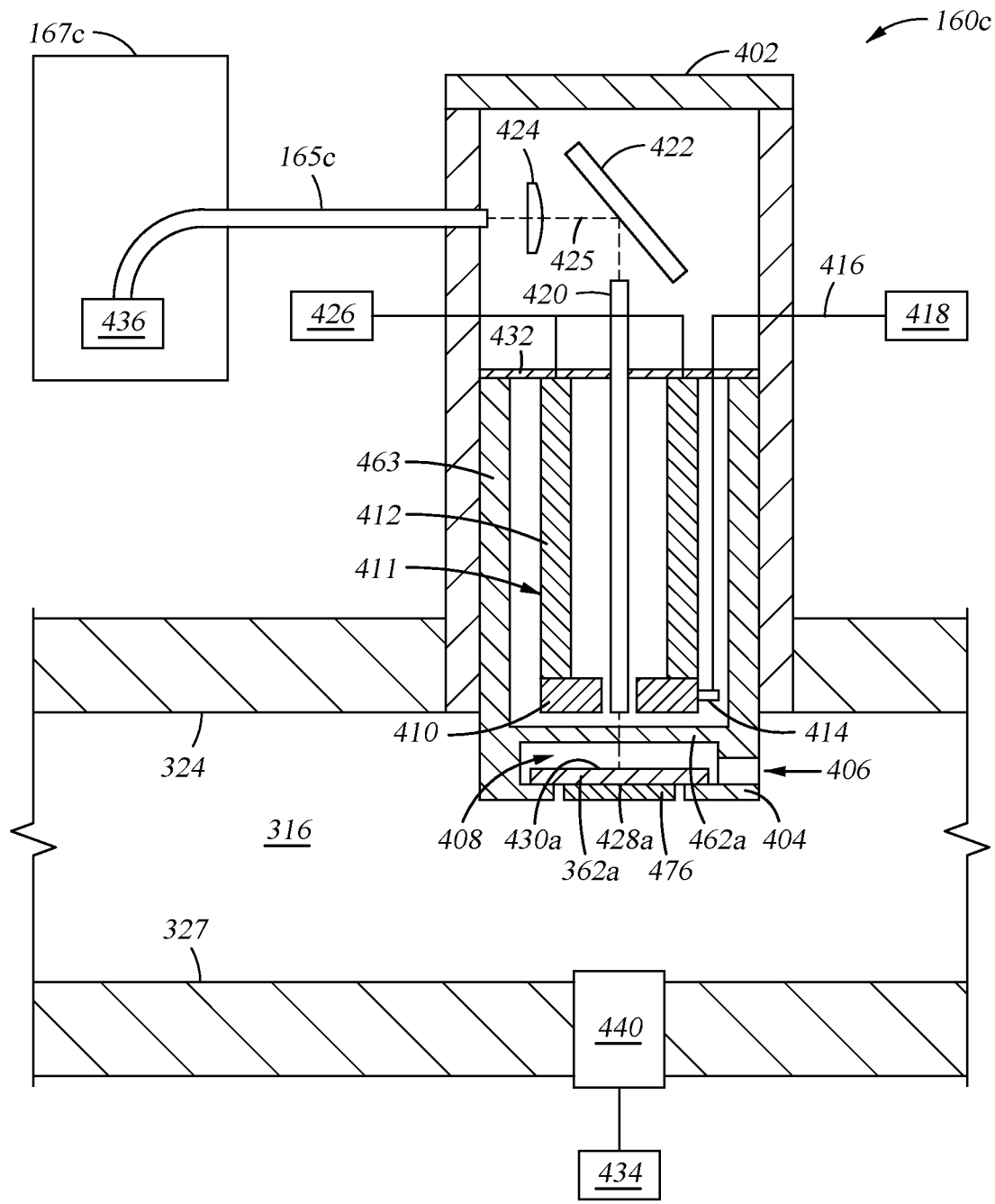

In the growth monitor 160b, the sensor coupon 362b is disposed such that a deposition surface 428 is oriented upward, such that the deposition surface 428 faces the inside upper surface 324. The sensor coupon 362b is disposed on top of an optically transparent window 462b, such that a backside surface 430b of the sensor coupon 362b is disposed on the optically transparent window 462b. The positioning of the sensor coupon 362b on top of the optically transparent window 462b enables the removal of the cover 404 of the growth monitor 160a of FIG. 4A as gravity holds the sensor coupon 362b on the optically transparent window 462b. The sensor coupon 362b is disposed in a pocket 435. The pocket 435 is a concave opening and is configured to receive the sensor coupon 362b. The optically transparent window 462b is a bottom surface of the pocket 435. As the sensor coupon 362b is disposed flush with the optically transparent window 462b there is also no backside sensor plenum 408 or equalization ports 406a, 406b. This opens the entire deposition surface 428 to exposure by exhaust gases FIG. 4C illustrates a third embodiment of a growth monitor 160c. The growth monitor 160c of FIG. 4C is similar to the growth monitor 160a of FIG. 4A, but the radiation source 434 is separated from the radiation sensor 436 and is disposed to transmit radiation through the sensor coupon 362a. The growth monitor 160c therefore measures the radiation transmitted through the sensor coupon 362a instead of reflected from the sensor coupon 362a. A radiation outlet 440 is disposed through the inside lower surface 327 of the exhaust collector 206.

Figure 4D:
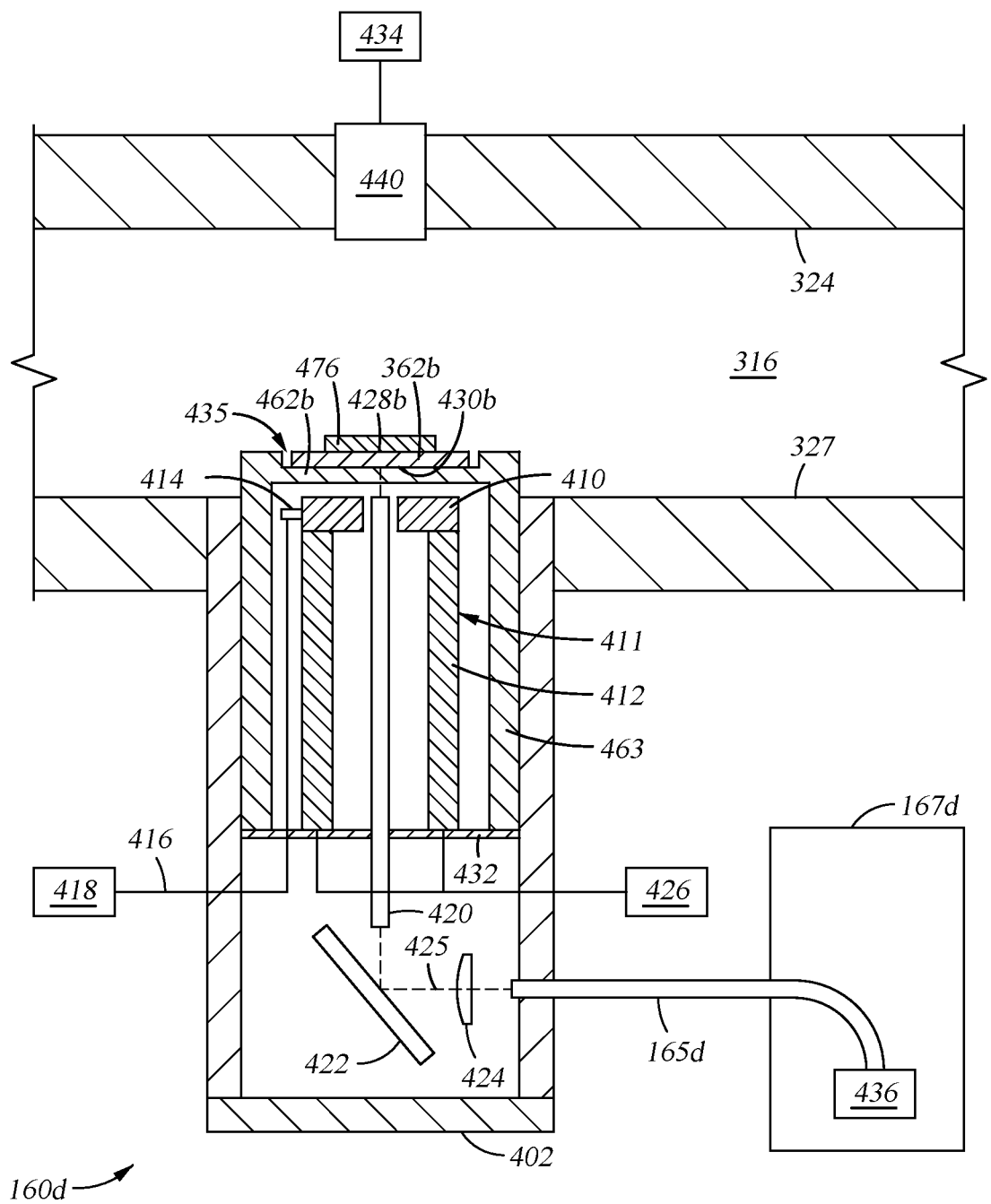

FIG. 4D illustrates a fourth embodiment of a growth monitor 160d. The growth monitor 160d of FIG. 4D is similar to the growth monitor 160b of FIG. 4B, but the radiation source 434 is separated from the radiation sensor 436 and is disposed to transmit radiation through the sensor coupon 362b. The growth monitor 160d therefore measures the radiation transmitted through the sensor coupon 362b instead of reflected from the sensor coupon 362b. A radiation outlet 440 is disposed through the inside upper surface 324 of the exhaust collector 206.

Figure 5:
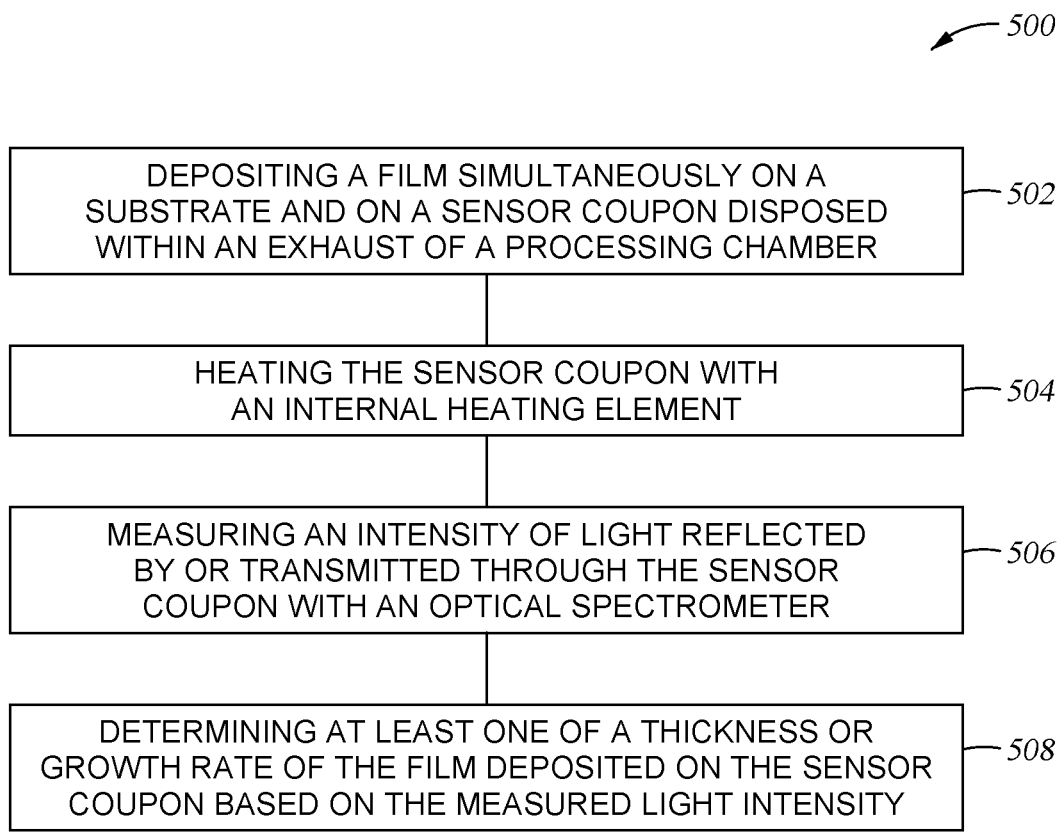
FIG. 5 is a schematic diagram view illustrating a method of processing a substrate, according to embodiments of the present disclosure.

FIG. 5 is a schematic diagram view illustrating a method 500 of processing a substrate. In one or more examples, the method 500 may be implemented using one of the example processing chambers and/or sensor assemblies disclosed herein. In one or more examples, the method 500 may be in the form of instructions stored on a computer readable medium (e.g., memory), that, when executed by a processor of a system (e.g., CPU), cause the system to implement the method 500. The computer readable medium and corresponding system are part of a controller, such as the controller 120.

At activity 502, a film is simultaneously deposited on a substrate, such as the substrate 102, and on a sensor coupon of a growth rate sensor, such as the sensor coupons 362a or 263b, disposed within a processing chamber, such as the deposition chamber 100. Depositing the film includes flowing one or more precursors or process gases from a process gas source and heating the substrate. The process gases are flowed over the surface of the substrate as a side injection while the substrate is rotated on a substrate support or susceptor. At activity 504, the sensor coupon, and an optically transparent window to which the sensor coupon is coupled, is heated using an internal heating element, such as the internal heating element 411, within the growth rate sensor. In one embodiment, which can be combined with other embodiments, heating the sensor coupon and the optically transparent window at least in part through the internal heating element includes applying power to a resistive heating element disposed within the growth rate sensor. The internal heating element is heated to a predetermined temperature, which is similar to a temperature of the substrate being processed in the process volume. The difference between a substrate temperature and the coupon temperature is less than about 50° C. during the activity 504, such as less than about 30° C., such as less than about 20° C. The temperature of the coupon and/or the internal heating element is measured separately using a temperature measurement device such as a thermocouple.

At activity 506, an intensity of radiation reflected by or transmitted through the sensor window is measured using an optical spectrometer, which is part of a radiation sensor. During activity 506 radiation may also be emitted by a radiation source. The radiation source may be a laser or an optical fiber. The radiation which is measured by the optical spectrometer and emitted by the radiation source is about 0.5 μm to about 6 μm, such as about 1 μm to about 5 μm, such as about 2 μm to about 4 μm.

At activity 508, at least one of a thickness or growth rate of the film deposited on the crystalline sensor window is determined based on the measured radiation intensity. In one embodiment, which can be combined with other embodiments, the determining of the thickness and/or the growth rate includes measuring a plurality of radiation intensity values of the radiation (which can include transmitted radiation and/or reflected radiation) across one or more time intervals. The plurality of radiation intensity values are correlated to reference data or physical models based on Fresnel's equations of electromagnetic wave reflection to determine the growth rate across one or more time intervals. The growth rate and/or the thickness (such as a thickness change) can correspond to a change in radiation intensity across the one or more time intervals. In one or more examples, a film thickness can be determined using the growth rate at a certain time interval.

Each of the growth monitors 160a, 160b, 160c, 160d described herein may be utilized with the deposition chamber 100 described herein or additional versions of semiconductor processing chambers. In some embodiments, the growth monitors 160a, 160b, 160c, 160d are placed in a different semiconductor processing chamber from those described herein, such as an atomic layer deposition (ALD) chamber, a physical vapor deposition (PVD) chamber, and other versions of a chemical vapor deposition (CVD) chamber. Placement of the growth monitors 160a, 160b, 160c, 160d reduces the amount of stray radiation from lamps or other heating elements compared to if the growth monitors 160a, 160b, 160c, 160d were located inside of the process volume 136 of the deposition chamber 100. However, by locating the growth monitors 160a, 160b, 160c, 160d inside of an exhaust, the growth monitors 160a, 160b, 160c, 160d are not heated by the same heating elements or lamps as the substrate 102. If the growth monitors 160a, 160b, 160c, 160d are not similar in temperature to the substrate 102, the quality of film growth and removal from a sensor coupon, such as the sensor coupons 362a, 362b, is degraded. Therefore, the growth monitors 160a, 160b, 160c, 160d as described herein have an internal heating element 411 disposed therein.

The internal heating element 411 enables the growth monitors 160a, 160b, 160c, 160d to be held at a temperature similar to the temperature of the substrate 102 while still having reduced background radiation. The use of a self-heated growth monitor 160a, 160b, 160c, 160d further enables flexible placement of the growth monitors 160a, 160b, 160c, 160d throughout the deposition chamber 100. Therefore, the growth monitors 160a, 160b, 160c, 160d may be placed in different portions of the exhaust system 178. Placement of the growth monitors 160a, 160b, 160c, 160d within the exhaust system 178 further reduces the complexity of the system inside of the process volume 136 compared to if the growth monitors 160a, 160b, 160c, 160d were placed inside of the process volume 136.

In embodiment of the present disclosure, a process chamber suitable for use during semiconductor substrate processing is described. The process chamber includes a chamber body, a substrate support disposed within a process volume of the chamber body, an upper window disposed above the substrate support and the process volume, a lower window disposed below the substrate support and the process volume, a gas injector disposed within the chamber body, an exhaust system disposed within the chamber body opposite the gas injection, and a growth rate sensor disposed within the exhaust system. The growth rate sensor includes an optically transparent window, a silicon containing coupon disposed on a first side of the optically transparent window, and a resistive heating element disposed on a second side of the optically transparent window.

In some embodiments, the growth rate sensor further includes a body, a radiation sensor, and an optical fiber disposed between the radiation sensor and the optically transparent window, wherein the optically transparent window is disposed at an end of the body and the resistive heating element is disposed inside of the body. The body further includes an outer body and an optically transparent inner body, wherein the optically transparent window is part of the optically transparent inner body.

While the foregoing is directed to embodiments of the present disclosure, other and further embodiments of the disclosure may be devised without departing from the basic scope thereof, and the scope thereof is determined by the claims that follow.

What is claimed is:

1. A growth rate sensor suitable for use during semiconductor substrate manufacturing, the growth rate sensor comprising:
   a body;
   an optically transparent window disposed at an end of the body;
   a silicon containing coupon disposed inside of the body and adjacent to a first side of the optically transparent window;
   a resistive heating element disposed within the body and adjacent to a second side of the optically transparent window;
   a radiation sensor; and
   an optical fiber disposed between the radiation sensor and the optically transparent window, wherein the optically transparent window is positioned in between the silicon containing coupon and the resistive heating element.

2. The growth rate sensor of claim 1, wherein the body further comprises:
   an outer body; and
   an optically transparent inner body, wherein the optically transparent window is part of the optically transparent inner body.

3. The growth rate sensor of claim 1, further comprising a radiation source configured to emit radiation which passes through or reflects off of the silicon containing coupon and is measured by the radiation sensor.

4. The growth rate sensor of claim 1, further comprising one or more of a mirror or a lens disposed between the radiation sensor and the optically transparent window.

5. The growth rate sensor of claim 1, further comprising a thermocouple adjacent to the resistive heating element.

6. The growth rate sensor of claim 1, further comprising a cover which partially surrounds the silicon containing coupon and secures the silicon containing coupon.

7. The growth rate sensor of claim 6, wherein a plenum is disposed between the optically transparent window and the silicon containing coupon.

8. The growth rate sensor of claim 7, wherein one or more equalization ports is disposed between an outside surface of the body and the plenum to allow pressure equalization between the plenum and a surrounding volume.

9. The growth rate sensor of claim 1, wherein the silicon containing coupon is a silicon carbide substrate.

10. An exhaust assembly suitable for use during semiconductor substrate manufacturing, the exhaust assembly comprising:
    one or more exhaust passage bodies;
    an exhaust collector disposed at a distal end of the one or more exhaust passage bodies;
    a growth rate sensor disposed within the exhaust collector and comprising:
       a body;
       an optically transparent window disposed at an end of the body;
       a silicon containing coupon disposed inside of the body and adjacent to a first side of the optically transparent window;
       a resistive heating element disposed within the body and adjacent to a second side of the optically transparent window;
       a radiation sensor; and
       an optical fiber disposed between the radiation sensor and the optically transparent window, wherein the optically transparent window is between the silicon containing coupon and the resistive heating element.

11. The exhaust assembly of claim 10, further comprising an exhaust conduit coupled to the exhaust collector.

12. The exhaust assembly of claim 11, wherein the growth rate sensor is disposed on an inside upper surface of the exhaust collector.

13. The exhaust assembly of claim 12, wherein a radiation source is disposed through an inside lower surface of the exhaust collector and configured to emit radiation towards the silicon containing coupon.

14. The exhaust assembly of claim 11, wherein the growth rate sensor is disposed on an inside lower surface of the exhaust collector.

15. The exhaust assembly of claim 14, wherein a radiation source is disposed through an inside upper surface of the exhaust collector and configured to emit radiation towards the silicon containing coupon.

16. The exhaust assembly of claim 10, wherein the silicon containing coupon is exposed to an exhaust volume within the exhaust collector.

17. A non-transitory computer-readable medium storing instructions that, when executed by a processor, cause a system to:
  monitor an intensity of radiation reflected by or transmitted through a growth rate sensor, the growth rate sensor comprising:
    a body:
    an optically transparent window disposed at an end of the body;
    a silicon containing coupon disposed inside of the body and adjacent to a first side of the optically transparent window;
    a resistive heating element disposed within the body and adjacent to a second side of the optically transparent window;
    a radiation sensor; and
    an optical fiber disposed between the radiation sensor and the optically transparent window, wherein the optically transparent window is between the silicon containing coupon and the resistive heating element;
  heat the silicon containing coupon using the resistive heating element during the monitoring of the intensity of the radiation; and
  determine a growth rate of a film deposited onto the silicon containing coupon from the change in the intensity of the radiation.

18. The medium of claim 17, wherein the growth rate sensor is positioned in an exhaust volume of a process chamber.

19. The medium of claim 18, wherein the growth rate of the film deposited onto the silicon containing coupon is correlated to a growth rate on a substrate within a processing volume of the process chamber.

20. The growth rate sensor of claim 1, wherein the first side of the optically transparent window is opposite the second side of the optically transparent window.

* * * * *